(12) United States Patent
Buffle et al.

(10) Patent No.: US 12,381,041 B2
(45) Date of Patent: Aug. 5, 2025

(54) ELECTRICAL DEVICE COMPRISING A CAPACITOR WHEREIN THE DIELECTRIC COMPRISES ANODIC POROUS OXIDE, AND THE CORRESPONDING MANUFACTURING METHOD

(71) Applicant: Murata Manufacturing Co., Ltd., Nagaokakyo (JP)

(72) Inventors: Larry Buffle, Grenoble (FR); Frédéric Voiron, Barraux (FR); Julien El Sabahy, Grenoble (FR); Brigitte Soulier, Grenoble (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 43 days.

(21) Appl. No.: 18/297,057

(22) Filed: Apr. 7, 2023

(65) Prior Publication Data
US 2023/0245834 A1    Aug. 3, 2023

Related U.S. Application Data

(63) Continuation of application No. PCT/IB2021/060036, filed on Oct. 29, 2021.

(30) Foreign Application Priority Data

Oct. 30, 2020    (EP) .................................... 20306307

(51) Int. Cl.
*H01G 4/012*    (2006.01)
*H01G 4/08*    (2006.01)
(Continued)

(52) U.S. Cl.
CPC ............... *H01G 4/33* (2013.01); *H01G 4/012* (2013.01); *H01G 4/10* (2013.01); *H10D 1/042* (2025.01);
(Continued)

(58) Field of Classification Search
CPC ............ H01G 4/33; H01G 4/012; H01G 4/10; H01G 4/085; H01L 28/87; H01L 28/91
See application file for complete search history.

(56) References Cited

U.S. PATENT DOCUMENTS 10,497,582 B2    12/2019   Voiron et al.
2005/0136609 A1   6/2005   Mosley et al.
(Continued)

FOREIGN PATENT DOCUMENTS

EP    3556910 A1    10/2019
WO    2007125510 A2   11/2007
(Continued)

OTHER PUBLICATIONS

International Search Report issued for PCT/IB2021/060036, date of mailing Feb. 28, 2022.

*Primary Examiner* — Michael P McFadden
(74) *Attorney, Agent, or Firm* — ArentFox Schiff LLP

(57) ABSTRACT

An electrical device that includes: a substrate; an anodic porous oxide region above the substrate; a first capacitor electrode region arranged in the anodic porous oxide region, extending in the anodic porous oxide region, the first capacitor electrode region having a first wall perpendicular to the top surface; a second capacitor electrode region arranged in the anodic porous oxide region, extending in the anodic porous oxide region, the second capacitor electrode region having a second wall perpendicular to the top surface and facing the first wall of the first capacitor electrode region, the first wall of the first capacitor electrode region and the second wall of the second capacitor electrode region being separated by a dielectric portion comprising a part of the anodic porous oxide region.

13 Claims, 8 Drawing Sheets

(51) Int. Cl.
*H01G 4/10* (2006.01)
*H01G 4/33* (2006.01)
*H10D 1/00* (2025.01)
*H10D 1/68* (2025.01)

(52) U.S. Cl.
CPC ............ *H10D 1/714* (2025.01); *H10D 1/716* (2025.01); *H01G 4/085* (2013.01)

(56) References Cited

U.S. PATENT DOCUMENTS

| | | | | |
|---|---|---|---|---|
| 2009/0052110 | A1* | 2/2009 | Masuda | H01G 4/005 361/303 |
| 2009/0154054 | A1* | 6/2009 | Masuda | H01G 4/005 361/275.1 |
| 2013/0189602 | A1* | 7/2013 | Lahiri | H01G 4/015 977/762 |
| 2014/0008111 | A1* | 1/2014 | Kuo | H01L 23/5223 174/257 |
| 2017/0358395 | A1* | 12/2017 | Ahn | H01G 9/07 |
| 2019/0157108 | A1* | 5/2019 | Liao | H01L 21/486 |
| 2020/0185155 | A1* | 6/2020 | Voiron | C25D 11/02 |
| 2021/0217454 | A1* | 7/2021 | Ocker | G11C 11/2273 |

FOREIGN PATENT DOCUMENTS

| | | | |
|---|---|---|---|
| WO | 2015063420 | A1 | 5/2015 |
| WO | 2019202046 | A1 | 10/2019 |

* cited by examiner

ELECTRICAL DEVICE COMPRISING A CAPACITOR WHEREIN THE DIELECTRIC COMPRISES ANODIC POROUS OXIDE, AND THE CORRESPONDING MANUFACTURING METHOD

CROSS REFERENCE TO RELATED APPLICATIONS

The present application is a continuation of International application No. PCT/IB2021/060036, filed Oct. 29, 2021, which claims priority to European Patent Application No. 20306307.8, filed Oct. 30, 2020, the entire contents of each of which are incorporated herein by reference.

FIELD OF THE INVENTION

The present invention relates to the field of integration and, more particularly, to electrical devices, related semiconductor products, and their methods of manufacture.

TECHNICAL BACKGROUND

Electronic components such as capacitors may be integrated into semiconductor products in a variety of forms. For example, planar capacitors may be formed above semiconductor substrates by forming two planar electrodes separated by a dielectric layer. However planar capacitors provide low capacitance density, this implies that a high value capacitance will consume a significant area of silicon.

To overcome this issue, it has been proposed to form three-dimensional structures to increase the capacitance of capacitors. Capacitance densities of the order of a Farad per $m^2$ have been achieved using three-dimensional (3D) capacitors.

A 3D capacitor comprises functional electrodes presenting a relief (for example they comprise a surface presenting a relief or they are formed on a relief such as a pore, a hole, a trench, or a pillar). Typically, it is possible to form a conductive 3D structure by using Deep Reactive Ion Etching, followed by subsequent deposition steps of a dielectric and of a conductive material to form a capacitor. Document WO 2007125510 discloses a method for forming such a 3D capacitor.

It has also been proposed to form capacitors inside of a porous insulating structure formed by anodizing a conductive layer, such a structure being disclosed in document WO 2015/063420.

While these solutions are suitable to increase the capacitance of integrated capacitors, there is also a need for devices which can operate under high voltages. For example, there is a need for capacitors having a high breakdown voltage.

There is also a need for devices which include several capacitors presenting different properties and most particularly different breakdown voltages.

The present invention has been made in the light of the above problems.

SUMMARY OF THE INVENTION

The present invention provides an electrical device comprising a capacitor, comprising: a substrate; an anodic porous oxide region above the substrate having a top surface; a first capacitor electrode region arranged in the anodic porous oxide region, extending in the anodic porous oxide region from its top surface, the first capacitor electrode region having a first wall perpendicular to the top surface; a second capacitor electrode region arranged in the anodic porous oxide region, extending in the anodic porous oxide region from its top surface, the second capacitor electrode region having a second wall perpendicular to the top surface and facing the first wall of the first capacitor electrode region, the first wall of the first capacitor electrode region and the second wall of the second capacitor electrode region being separated by a dielectric portion comprising a part of the anodic porous oxide region so that a capacitor is formed by the first capacitor electrode region, the second capacitor electrode region, and the dielectric portion.

Anodizing a metal layer in a wet etchant bath leads to an anisotropic etch which forms vertical pores in a metal layer, as the etching speed in the pores in faster than the etching speed of the formed oxide. This can lead to structures which have a very high aspect ratio (above 1:50).

This porous structure is an oxide and can act as a dielectric, for example with the pores remaining empty or with the pores being filled with a dielectric material. In the porous structure, the pores can occupy (for example) 80% of the volume, which means that the dielectric portion comprises 20% of anodic oxide while the remaining 80% can be empty or filled with a deposited material.

Typically, the pores have a diameter of the order of tens of nanometers (for example 80 nanometers). This implies that should the pores be filled with a material, a thickness of only about half of the pore diameter should be deposited to fill the pores. This allows using deposition methods which are traditionally used for thin film depositions while obtaining a thick structure (the depth of the pores) comprising for example 80% of the deposited material.

It follows that using the porous structure allows forming capacitors in which it is easy to configure the capacitance by:
- Modifying the layout of the electrodes to increase the surface area of the capacitor electrode regions,
- Modifying the thickness of the anodic porous oxide region and of the electrode regions,
- Controlling the distance between the electrode regions, and/or
- Modifying the porous region by changing the pore dimensions or filling the pores.

Additionally, the above structure allows controlling the breakdown voltage of capacitors easily, for example by adjusting controlling the distance between the electrode regions and/or modifying the porous region by changing the pore dimensions or filling the pores.

Preferably, the dielectric portion may only comprise anodic porous oxide, and eventually a filling material in the pores: there is no conductive material between the two electrode regions.

For example, different electrical potentials can be applied respectively to the two capacitor electrode regions which are not electrically connected together.

The capacitor can also be surrounded by a surrounding porous region, for example with empty pores. This surrounding porous region can be arranged partially between an interconnection or a conductive line and the capacitor. This will limit parasitic effects.

According to a particular embodiment the first capacitor electrode region comprises two substantially parallel (for curved walls, the corresponding tangents are substantially parallel) first walls respectively facing two substantially parallel second walls of the second capacitor electrode region, and wherein the dielectric portion extends between each first wall of the first capacitor electrode region and each second wall of the second capacitor electrode region which are facing.

This particular structure, with a complex geometry, ensures that most of the surface area of the device will be used to increase the capacitance of the device.

According to a particular embodiment, the first capacitor electrode region and the second capacitor electrode region are arranged in an interlocking-comb structure or an interlocking spiral structure.

These two structures make full use of the surface area to be used by the capacitor.

According to a particular embodiment, the dielectric portion further comprises a filling material inside at least a group of pores of the part of the anodic porous oxide region comprised in the dielectric portion.

This filling material can be used to adapt the properties of the dielectric part: permittivity, robustness (in terms of breakdown voltage), etc.

By way of example, a mask can be used to prevent the filling of a portion of the pores.

According to a particular embodiment, the filling material is arranged in all the pores of the part of the anodic porous oxide region comprised in the dielectric portion.

For example, if the anodic porous oxide region comprises 20% of oxide and 80% of pores, then the dielectric region can comprise 80% of the filling material.

According to a particular embodiment, at least one pore of the part of the anodic porous oxide region comprised in the dielectric portion is not filled with the filling material.

For example, the at least one pore not filled with the filling material can be empty.

According to a particular embodiment, is a dielectric material (i.e., any suitable dielectric material), or the filling material is a high-K dielectric, or the filling material is a low-K dielectric.

A low-K dielectric has a relative dielectric constant which is lower than the relative dielectric constant of silicon dioxide (3.9). A high-K dielectric has a relative dielectric constant which is higher than the relative dielectric constant of silicon dioxide.

For example, the low-K dielectric can be silicon oxycarbide (SiOC) or a polymer such as Parylene or Polyimide, or a SiO2 based dielectric (for example oxynitride). The high-K dielectric can be hafnium oxide (HfO2 or zirconium dioxide (ZrO2).

For example, high-K dielectrics can be used to increase the capacitance of the capacitors. High-K dielectrics are usually deposited using methods such as Atomic Layer Deposition, but such methods limit the achievable thickness. However, by using the porous structure, it is possible to fill approximately 80% of the dielectric portion by depositing a layer of high-K dielectric having a thickness of about half of the pore diameter. The 80% of high-K dielectric is obtained for a structure having a height of about 20 micrometers, which is unattainable when depositing high-K dielectrics.

Preferably, the filling material is deposited using Atomic Layer Deposition (ALD).

Low-K dielectrics can be used to leverage their ability to withstand large breakdown voltages, also for structures having a thickness of about 20 micrometers.

According to a particular embodiment, the device further comprises a conductive pattern arranged between the substrate and the anodic porous region and/or between the substrate and the first capacitor electrode region or the second capacitor electrode region.

This conductive pattern is electrically connected to the metal layer which will be anodized, and it will propagate the anodizing potential during the anodizing process. Preferably, the conductive pattern comprises a material which anodizes at a speed which is much smaller than the anodizing speed of the metal layer which will be anodized.

This particular embodiment prevents the formation of non-anodized metal islands surrounded by anodic porous oxide.

According to a particular embodiment, the conductive pattern is arranged only between the substrate and one capacitor electrode region selected between the first and the second, and the conductive pattern is electrically connected to the same electrical potential as this selected capacitor electrode region.

This particular embodiment prevents parasitic capacitors from appearing between the capacitor electrode regions and the conductive pattern.

According to a particular embodiment, the device comprises at least two of said capacitors, the at least two of said capacitors having a different capacitance value, and/or a different breakdown voltage value.

As explained above, a modification of the layout of the capacitor electrodes or of the filling material can lead to a change of capacitance or of the breakdown voltage, and this allows forming different capacitors in a same device with a single manufacturing process.

According to a particular embodiment, the anodic porous oxide region has a thickness above 3 micrometers or preferably above 10 micrometers.

According to a particular embodiment, the dielectric portion has a width measured from the first wall of the first capacitor electrode region to the second wall of the second capacitor electrode region above 500 nanometers or above 1 micrometer.

Larger dielectrics can provide more robustness in terms of breakdown voltage.

The present invention also provides a method for manufacturing an electrical device comprising a capacitor, comprising: providing an anodizable layer above a substrate; anodizing at least a portion of the anodizable layer so as to obtain an anodic porous oxide region having a top surface; forming a first cavity extending in the anodic porous oxide region from its top surface so as to define a first cavity wall perpendicular to the top surface; forming a second cavity extending in the anodic porous oxide region from its top surface so as to define a second cavity wall perpendicular to the top surface and facing the first cavity wall of the first cavity; filling at least partially the first cavity with an electrically conductive material so as to obtain a first capacitor electrode region arranged in the anodic porous oxide region having a first wall perpendicular to the top surface; and filling at least partially the second cavity with an electrically conductive material so as to obtain a first capacitor electrode region arranged in the anodic porous oxide region having a second wall perpendicular to the top surface and facing the first wall of the first capacitor electrode region, the first wall of the first capacitor electrode region and the second wall of the second capacitor electrode region being separated by a dielectric portion comprising a part of the anodic porous oxide region so that a capacitor is formed by the first capacitor electrode region, the second capacitor electrode region, and the dielectric portion.

This method can be adapted to form any one of the above-defined electrical devices.

According to a particular embodiment, the method further comprises filling, with a filling material, at least a group of pores of the anodic porous oxide region separating the first wall of the first capacitor electrode region from the second wall of the second capacitor electrode region.

According to a particular embodiment, the filling step comprises an atomic layer deposition step.

Depositing thick layers using ALD can be a challenge. However, using the porous structure as a template to be filled allows obtaining thick structures (for example above 10 µm) containing 80% (for example) of material deposited by ALD.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

We will now describe a device equipped with a capacitor and the corresponding fabricating method according to an example.

Figure 1:
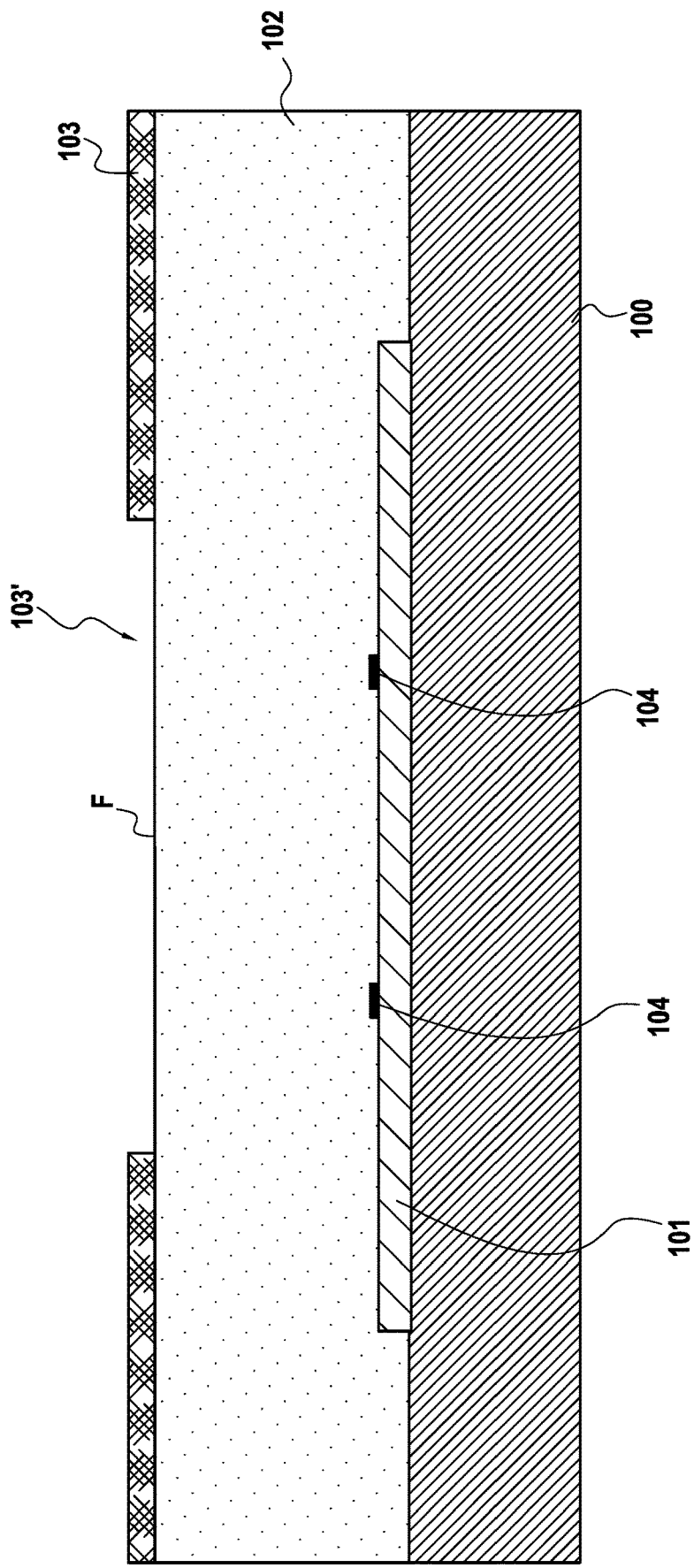
FIG. 1, is a cross-section of a base structure in which a capacitor will be formed.

FIG. 1 shows a base structure which may be used to implement the steps of a method for fabricating a device in accordance with this example. More precisely, FIG. 1 is a cross-section of a base structure comprising a substrate 100 above which the capacitor will be formed.

The substrate 100 may comprise an insulating material, a conductive material, or a semi-conductor material. Should this substrate 100 comprise a semi-conductor material, it may also comprise passive components (integrated resistors, for example) or active components (transistors, etc.): the capacitor which will subsequently be formed can therefore be formed directly above components in a manner which will limit any undesired parasitic effect.

Above the substrate 100, an insulating layer 101 has been formed. A metal layer 102 is formed above the substrate 100 and the insulating layer 101. The metal layer 102 will be anodized to as to obtain an anodic porous oxide region. Hence, the material comprised in this conductive layer is an anodizable metal such as aluminum. The thickness of this layer will set the maximum thickness of the anodic porous oxide region which will be formed subsequently, and the height of the electrodes of the capacitor which will be formed subsequently. By way of example, the aluminum layer can have a thickness of the order of 10 or 20 µm.

Delimiting the area to be anodized can be performed by means of a hard-mask 103, as disclosed in application WO 2019/202046. As shown on the figure, the hard-mask 103 comprises an opening 103' which opens onto the metal layer 102.

If the surface area of the opening 103' is large, or if the thickness to be anodized is large, it is preferable to form a conductive pattern 103 between the insulating layer 101 and the aluminum layer 102. This allows ensuring that the anodizing potential is applied evenly in the region to be anodized and prevents the formation of a not anodized island surrounded by anodized material (which will be electrically insulated from the sides of the conductive layer 102 where the potential is applied). The conductive pattern 103 ensures that a good distribution of the anodizing potential is obtained across the entire region to be anodized. The conductive pattern 103 can comprise tungsten, as tungsten forms a barrier which prevents further oxidation of the tungsten so that a good portion of conductive material remains.

Figure 2:
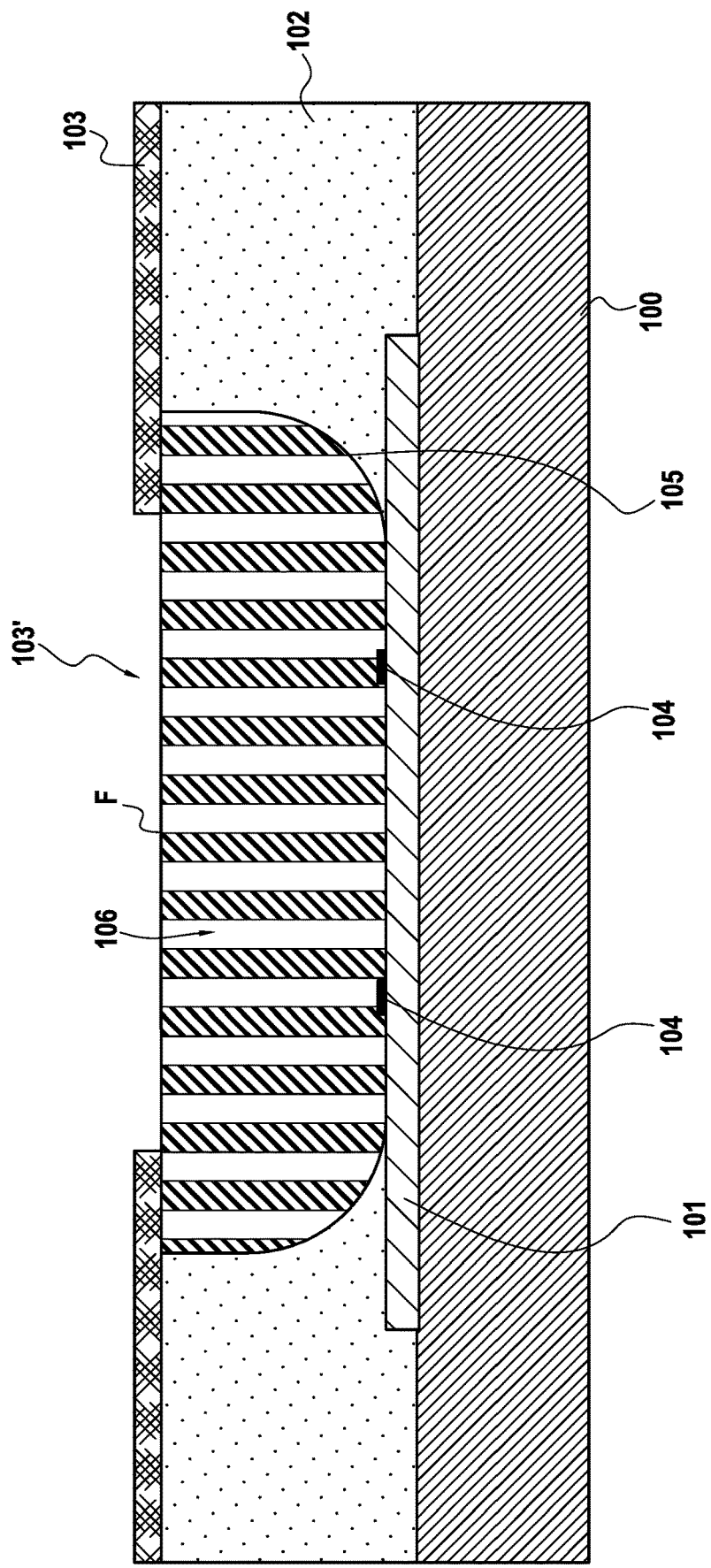
FIG. 2 shows the structure of FIG. 1 after an anodizing process has been carried out.

FIG. 2 shows the structure of FIG. 1 after an anodizing step has been carried out to obtain an anodic porous oxide region 105 having a top surface F. Below the opening 103', pores 106 have been formed and these pores are formed so as to be straight pores which reach the bottom of the metal layer 102.

If the metal layer 102 comprises aluminum, the anodic porous oxide region 105 comprises alumina around the pores and is electrically insulating.

The diameter of the pores can be adapted by modulating the anodizing voltage and by selecting an appropriate acid for the anodizing process. Typically, these parameters of the anodizing process are selected so as to provide an anodic porous oxide region comprising 80% of void and 20% of oxide (for example alumina).

Figure 3:
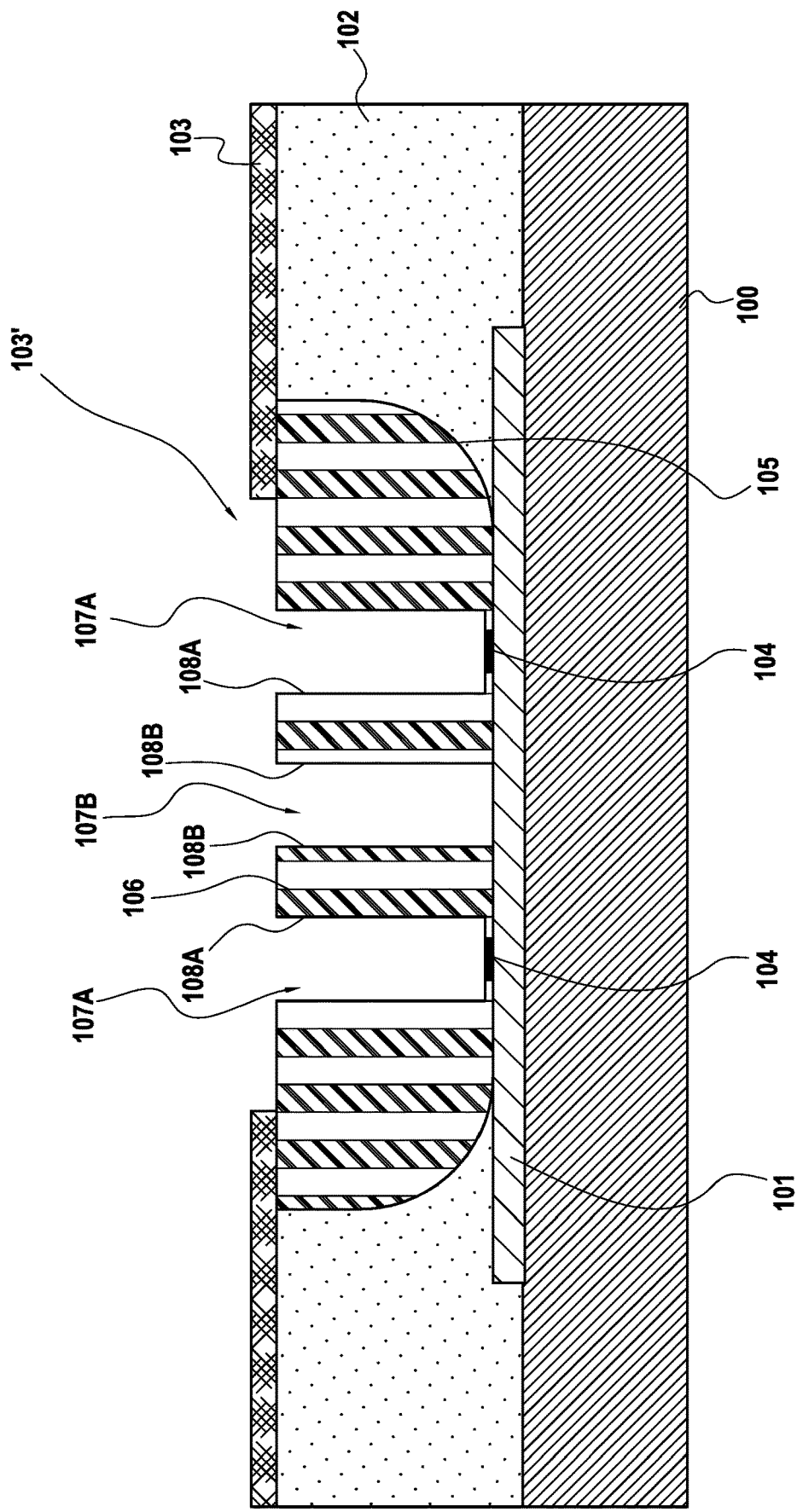
FIG. 3 shows the structure of FIG. 2 after trenches have been formed.

FIG. 3 shows the implementation of a step in which trenches 107A and 107B are formed in the anodic porous oxide region. The trenches 107A and 107B are delimited during a photolithographic process. The invention is not limited to trenches and can also be applied using other types of cavities.

As can be seen on the figure, there are two trenches designated under reference 107A and only one trench 107B arranged between the other two trenches. The two trenches designated under reference 107A are part of a same trench. For example, the two trenches 107A belong to a U-shaped trench.

The trench 107A comprises two first walls 108A which respectively face two second walls 108B of the trench 107B. By facing, what is meant is that there is only anodic porous oxide between these walls, and no trench. In other words, the walls are facing directly.

Figure 4:
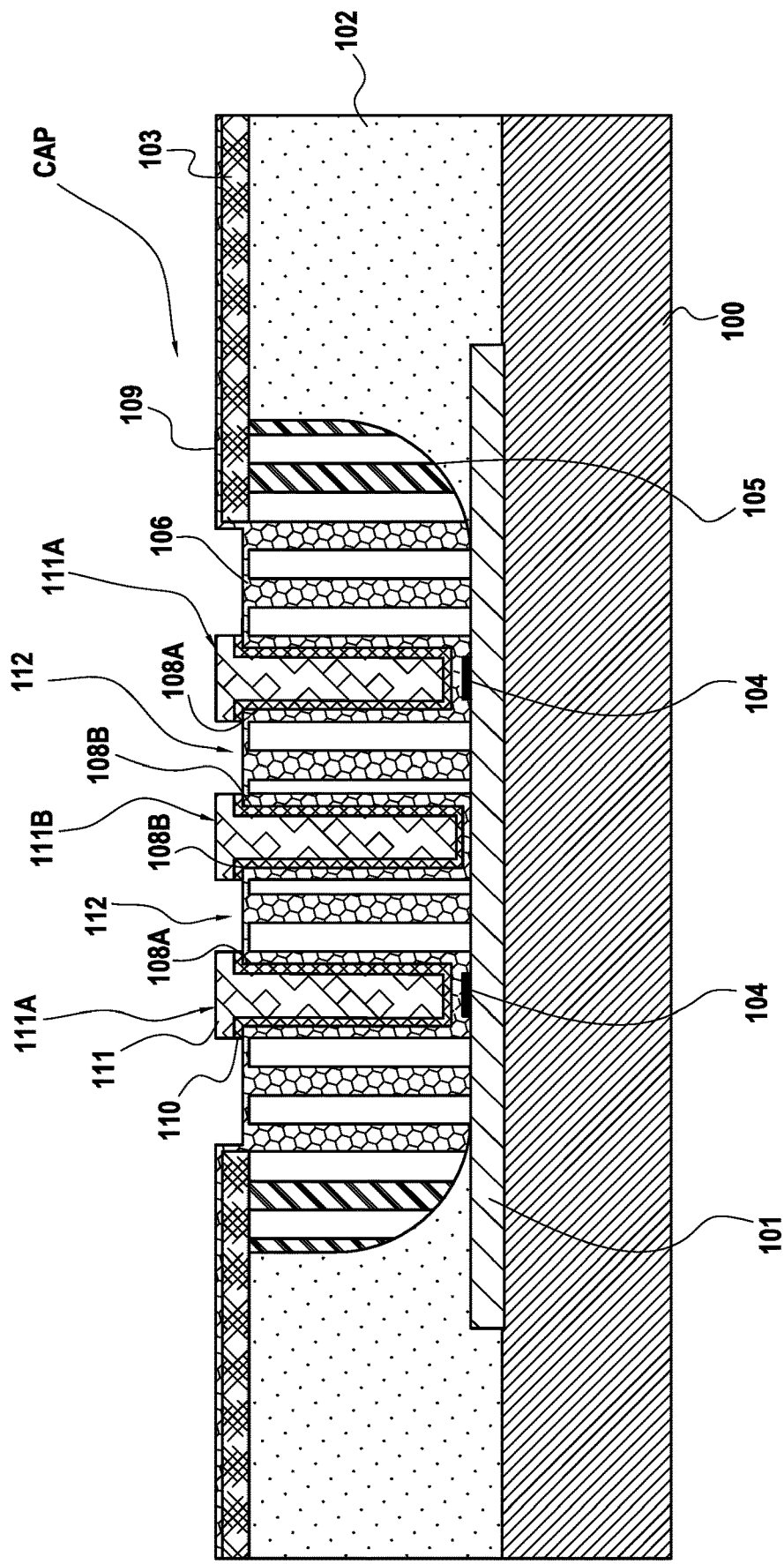
FIG. 4 shows the structure of FIG. 3 after capacitor electrode regions have been formed.

FIG. 4 shows the structure of FIG. 3 after a step of filling, with a filling material 109, the anodic porous oxide region, and after a step of forming capacitor electrode regions.

Filling the anodic porous oxide region can be implemented by an ALD process, and the filling material can be, preferably, a material selected for its relative permittivity (high-K or Low-K).

By way of example, the filling material can be hafnium oxide (HfO2). Depositing tens of micrometers of hafnium oxide using ALD is not conceivable as it would require too much time. However, filling the anodic porous oxide region with hafnium oxide deposited by ALD can be done by depositing a layer having a thickness of about half of the pore diameter (tens of nanometers, for example 80 nanometers). While the obtained structure does not contain only hafnium oxide, it contains 80% of hafnium oxide, for a thickness of 10 or 20 micrometers.

The filling material 109 can also be deposited in the previously described trenches 107A and 107B.

In the trenches, a conductive seed layer 110 can be deposited so that subsequently, an electrically conductive material 111 can be deposited by electrodeposition so as to fill the trenches. The seed layer 110 and the electrically conductive material 111 are patterned so as to form a first capacitor electrode region 111A in trench 107A and a second capacitor electrode region 111B in trench 107B.

The first walls 108A are now the walls of the first capacitor electrode region and they face the second walls of the second capacitor electrode region.

The part of the porous region 105 filled with the filling material 109 and which is arranged each first and second wall forms a dielectric portion 112 separating the capacitor electrode regions 111A and 111B: a capacitor CAP is formed.

It should be noted that on the figure, the conductive pattern 104 is only arranged bellow the first capacitor electrode region. The conductive pattern should preferably be electrically connected to the first capacitor electrode region so that no parasitic capacitor appears between the first capacitor electrode region 111A and the conductive pattern 104. Also, the conductive pattern has a width which is less than the width of the capacitor electrode region 111A so that it will not affect the width of the functional dielectric between the capacitor electrode regions at the bottom of the structure, which is determined by the distance between the walls of these regions.

Figure 5:
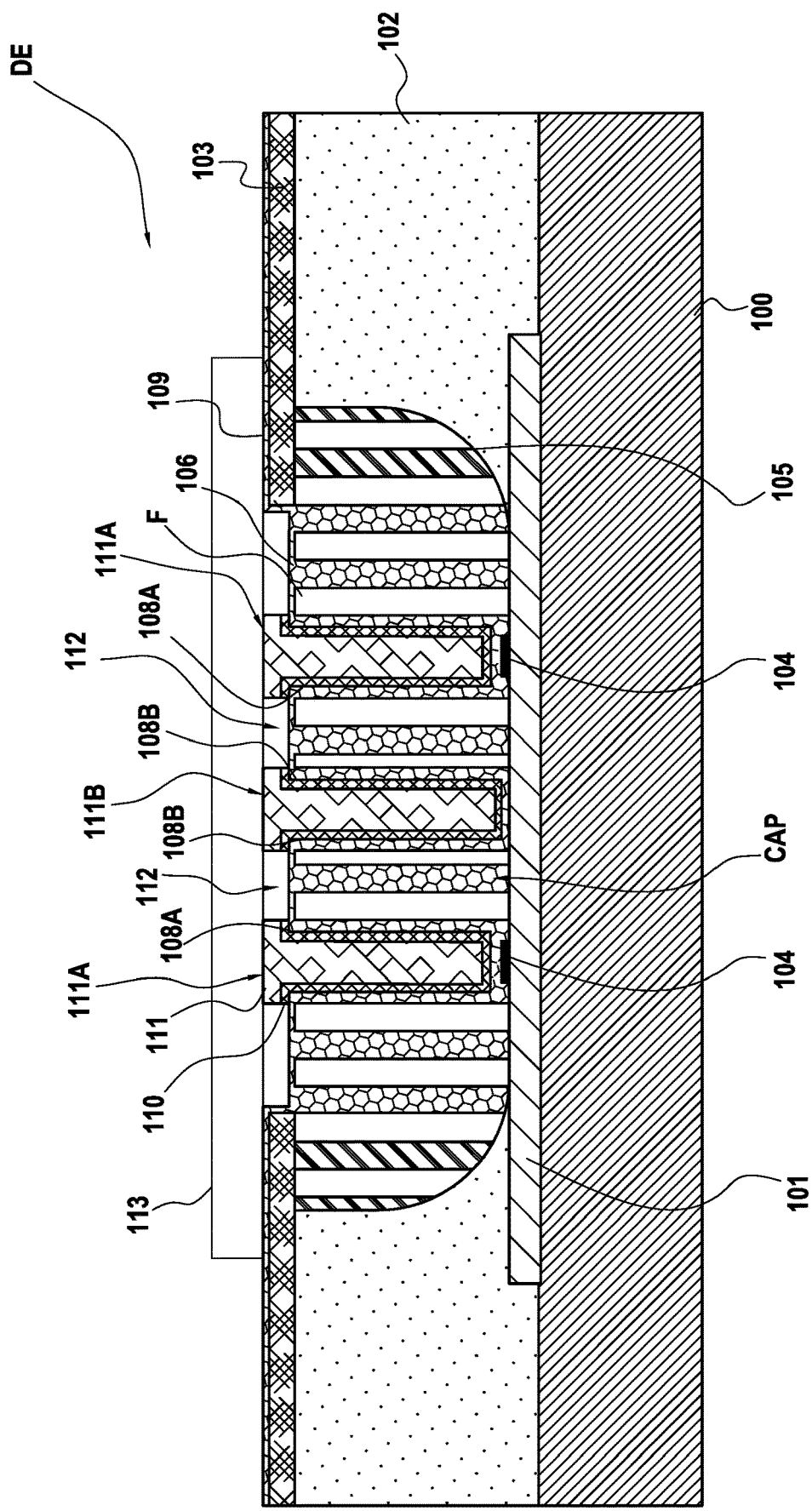
FIG. 5 shows the structure of FIG. 4 after an additional device has been connected thereto.

FIG. 5 shows a device DE including the capacitor CAP with an additional device 113 directly connected to the capacitor electrodes 111A and 111B (which are salient with respect to the top surface F of the anodic porous oxide region). The additional device can be, for example, an interposer, or a semiconductor chip comprising active components. This direct connection ensures that the additional device is close to the capacitor CAP, which further limits the parasitic effects.

It should be noted that the capacitor CAP is very low-profile (with a thickness of 10 or 20 µm), which implies that the parasitic effects (ESR/ESL) will be negligible.

Figure 6:
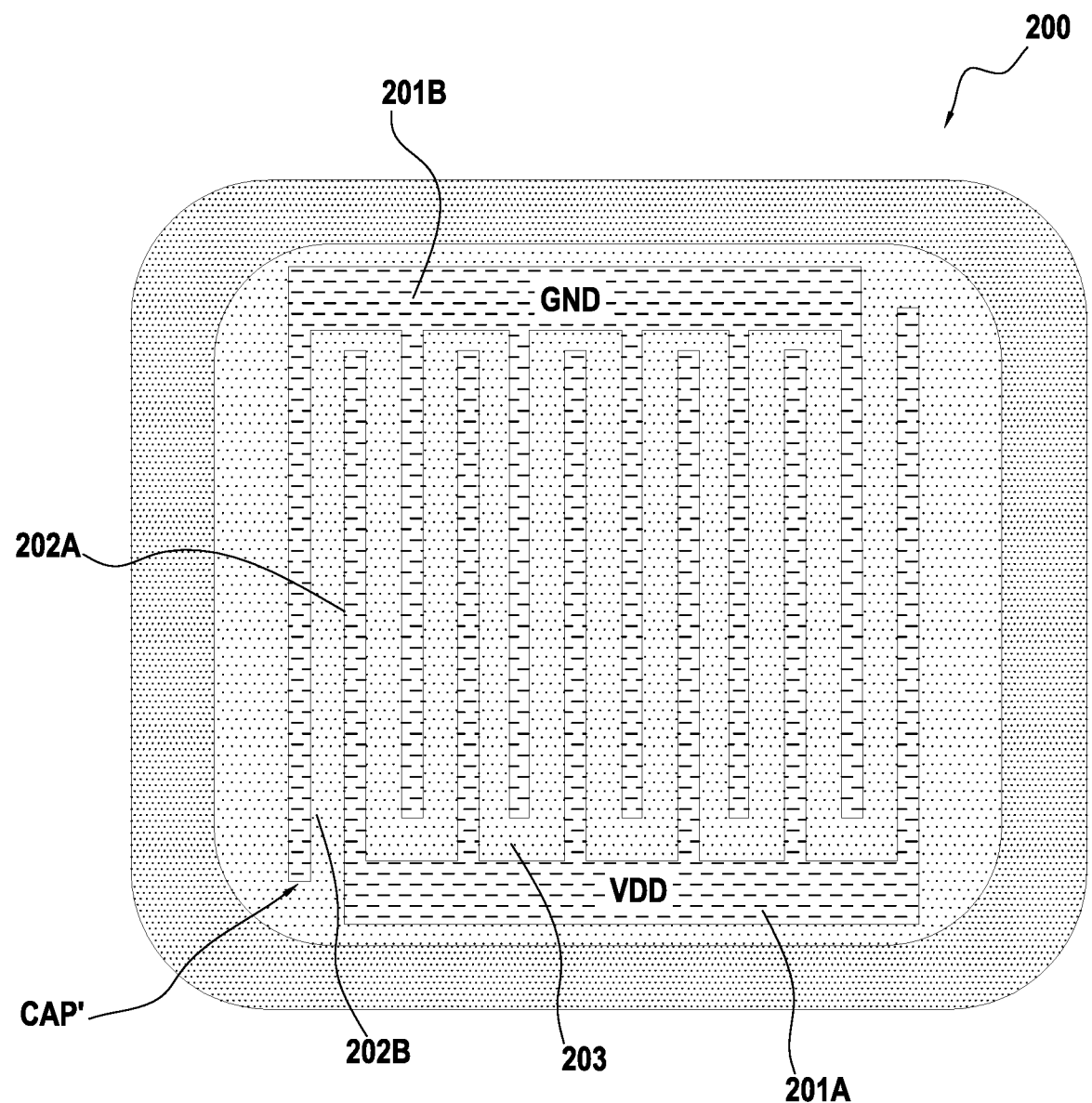
FIG. 6 shows an example of layout.

FIG. 6 is an exemplary layout, or top-view, for a device 200 comprising a capacitor CAP' formed by a capacitor electrode region 201A (here connected to VDD) with first walls 202A, a capacitor electrode region 201B with second walls 202B, and an anodic porous oxide region 203 separating the first walls from the second walls.

As can be seen on the figure, an interlocking comb structure is used.

Other structures could be used, for example interlocking spirals.

Figure 7:
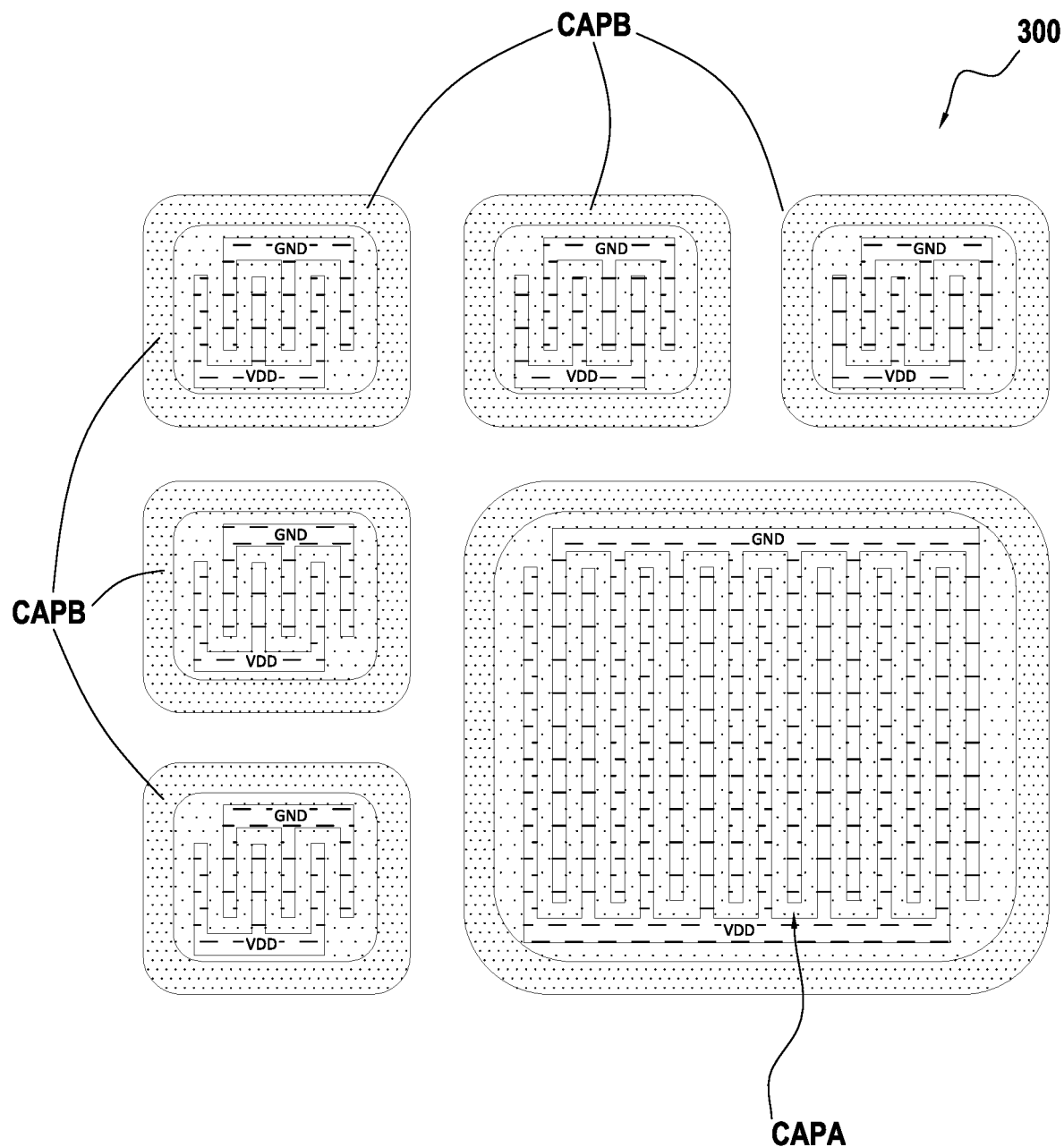
FIG. 7 shows another example of layout.

FIG. 7 shows another exemplary layout of a device 300 comprising a plurality of capacitors and most notably capacitor CAPA having a first layout (and consequently a first capacitance value) and capacitors CAPB having a second layout (and consequently a second capacitance value).

It should be noted that it is also possible to form devices having different widths of anodic porous oxide, or anodic porous oxides filled with different materials in a same device.

Figure 8:
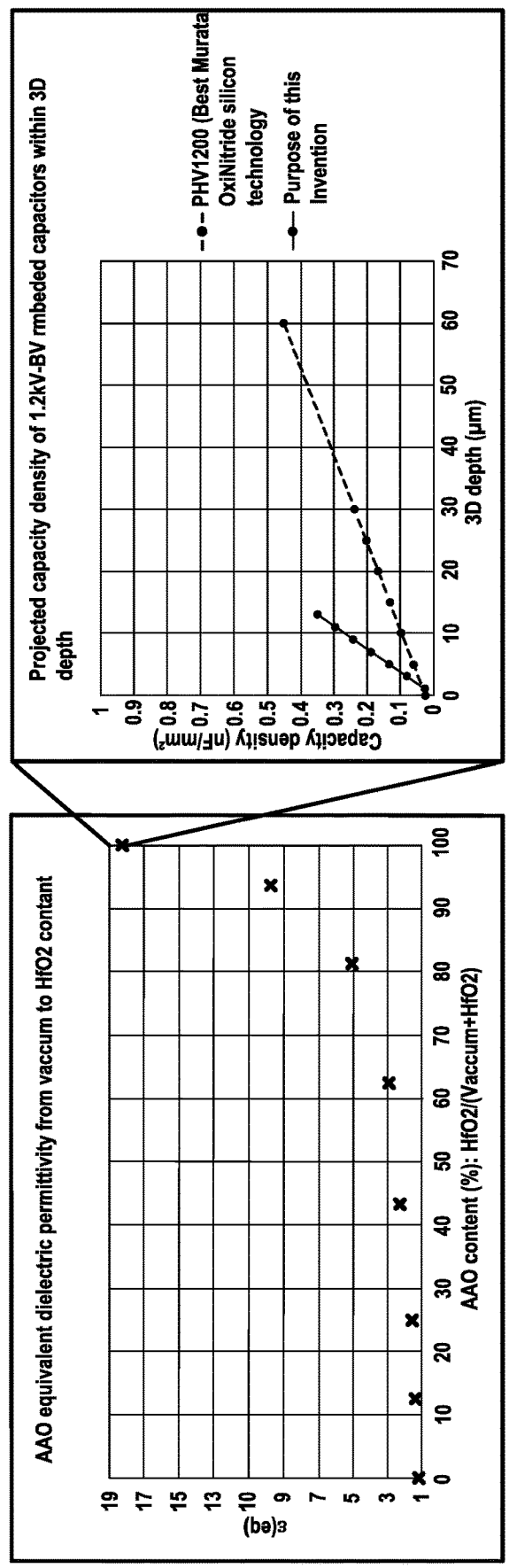
FIG. 8 shows two graphs indicating the permittivity and capacitance of various exemplary structures.

FIG. 8 comprises a first graph on its left side, which shows how the quantity of hafnium oxide in an anodic porous oxide region affects the permittivity of the dielectric. In this example, the anodic porous oxide region comprises alumina, with a thickness of 13 micrometer, and a width for the dielectric of 3 micrometers, and the electrode regions have a width of 1 micrometer.

A relative permittivity of about 18.3 can be obtained in a structure in which the pores are completely filled with hafnium oxide.

The graph on the right of FIG. 8 shows, for a structure having a 1.2 kV breakdown voltage, the effect of the depth of the anodic porous oxide region on the capacitance density, for an implementation of the invention, against an equivalent high aspect-ratio structure from the prior art comprising oxinitride, as disclosed in document EP3588560.

As can be seen on the graph, the capacitance density if 3.6 times denser in the structure according to the invention.

The embodiments as described above allow obtaining integrated capacitors which can be used for various applications and most notably high-voltage applications, with a low-profile structure. For example, the capacitors can have dielectric widths of about a few micrometers to be able to withstand applications in which the operating the operating voltage is about a kV.

The structure of the invention is particularly suitable to allow using deposition techniques meant for depositing very thin layers (for example less than about 50 nm, which corresponds to a breakdown voltage of less than about 50 V), for high voltage applications (for example around 1.2 kV). For example, atomic layer deposition can be used as a deposition technique for reaching breakdown voltages of around 1.2 kV.

While atomic layer deposition is known to be able to deposit films on very large surfaces but with a thickness of less than 100 nm or even less than 50 nm, using this technique on the structures of the prior art to form a dielectric would not be able to achieve the thickness required for high voltage applications. By using atomic layer deposition on a porous structure in accordance with the invention, a deposition thickness of only about 50 nm is used while the breakdown voltage can reach about 1.2 kV, and the processing time/precursor consumption remains within the usual ranges of the prior art which were limited to breakdown voltages of about 50 V.

The invention claimed is:

1. An electrical device comprising a capacitor, comprising:
    a substrate;
    an anodic porous oxide region above the substrate having a top surface;
    a first capacitor electrode region arranged in the anodic porous oxide region, extending in the anodic porous oxide region from its top surface, the first capacitor electrode region having a first wall perpendicular to the top surface; and
    a second capacitor electrode region arranged in the anodic porous oxide region, extending in the anodic porous oxide region from its top surface, the second capacitor electrode region having a second wall perpendicular to the top surface and facing the first wall of the first capacitor electrode region,
    the first wall of the first capacitor electrode region and the second wall of the second capacitor electrode region being separated by a dielectric portion comprising a part of the anodic porous oxide region so that a capacitor is formed by the first capacitor electrode region, the second capacitor electrode region, and the dielectric portion, wherein the dielectric portion further comprises a filling material inside at least a group of pores of the part of the anodic porous oxide region comprised in the dielectric portion.

2. The electrical device according to claim 1, wherein the first capacitor electrode region comprises two substantially parallel first walls respectively facing two substantially parallel second walls of the second capacitor electrode region, and wherein the dielectric portion extends between each first wall of the first capacitor electrode region and each second wall of the second capacitor electrode region which are facing.

3. The electrical device according to claim 2, wherein the first capacitor electrode region and the second capacitor electrode region are arranged in an interlocking-comb structure or an interlocking spiral structure.

4. The electrical device of claim 1, wherein the filling material is arranged in all the pores of the part of the anodic porous oxide region comprised in the dielectric portion.

5. The electrical device of claim 1, wherein at least one pore of the part of the anodic porous oxide region comprised in the dielectric portion is not filled with the filling material.

6. The electrical device of claim 1, wherein the filling material is a dielectric material, or the filling material is a high-K dielectric, or the filling material is a low-K dielectric.

7. The electrical device of claim 1, further comprising a conductive pattern arranged between the substrate and the anodic porous region and/or between the substrate and the first capacitor electrode region or the second capacitor electrode region.

8. The electrical device of claim 7, wherein the conductive pattern is arranged only between the substrate and one capacitor electrode region selected between the first and the second, and the conductive pattern is electrically connected to a same electrical potential as this selected capacitor electrode region.

9. The electrical device of claim 1, comprising at least two of said capacitors, the at least two of said capacitors having a different capacitance value, and/or a different breakdown voltage value.

10. The electrical device of claim 1, wherein the anodic porous oxide region has a thickness above 3 micrometers.

11. The electrical device of claim 1, wherein the dielectric portion has a width measured from the first wall of the first capacitor electrode region to the second wall of the second capacitor electrode region above 500 nanometers.

12. A method for manufacturing an electrical device comprising a capacitor, the method comprising:
providing an anodizable layer above a substrate;
anodizing at least a portion of the anodizable layer so as to obtain an anodic porous oxide region having a top surface;
forming a first cavity extending in the anodic porous oxide region from its top surface so as to define a first cavity wall perpendicular to the top surface;
forming a second cavity extending in the anodic porous oxide region from its top surface so as to define a second cavity wall perpendicular to the top surface and facing the first cavity wall of the first cavity;
filling at least partially the first cavity with an electrically conductive material so as to obtain a first capacitor electrode region arranged in the anodic porous oxide region having a first wall perpendicular to the top surface; and
filling at least partially the second cavity with an electrically conductive material so as to obtain a first capacitor electrode region arranged in the anodic porous oxide region having a second wall perpendicular to the top surface and facing the first wall of the first capacitor electrode region,
the first wall of the first capacitor electrode region and the second wall of the second capacitor electrode region being separated by a dielectric portion comprising a part of the anodic porous oxide region so that a capacitor is formed by the first capacitor electrode region, the second capacitor electrode region, and the dielectric portion, and
further comprising filling, with a filling material, at least a group of pores of the anodic porous oxide region separating the first wall of the first capacitor electrode region from the second wall of the second capacitor electrode region.

13. The method according to claim 12, wherein the filling comprises an atomic layer deposition step.

* * * * *